United States Patent [19]

Tanabe

[11] Patent Number: 5,391,901

[45] Date of Patent: Feb. 21, 1995

[54] SEMICONDUCTOR MEMORY WITH OBLIQUE FOLDED BIT-LINE ARRANGEMENT

[75] Inventor: Nobuhiro Tanabe, Tokyo, Japan

[73] Assignee: NEC Corporation, Tokyo, Japan

[21] Appl. No.: 139,718

[22] Filed: Oct. 22, 1993

[30] Foreign Application Priority Data

Oct. 30, 1992 [JP] Japan ................................. 4-316612

[51] Int. Cl.$^6$ ...................... H01L 27/10; H01L 23/48
[52] U.S. Cl. ..................................... 257/296; 257/773
[58] Field of Search ................... 257/296, 773; 365/63, 365/72

[56] References Cited

U.S. PATENT DOCUMENTS

| | | | | |
|---|---|---|---|---|
| Re. 32,236 | 8/1986 | Scheuerlein | ......................... | 257/390 |
| 4,914,502 | 4/1990 | Lebowitz et al. | ..................... | 257/773 |
| 5,062,077 | 10/1991 | Takashima et al. | ................. | 257/296 |
| 5,194,752 | 3/1993 | Kumagai et al. | ...................... | 365/72 |
| 5,315,542 | 5/1994 | Melzner | ................................. | 365/72 |

*Primary Examiner*—Robert P. Limanek
*Attorney, Agent, or Firm*—Sughrue, Mion, Zinn, Macpeak & Seas

[57] ABSTRACT

A plurality of word lines extend linearly and parallel to each other. A reference word line is positioned to divide the word lines into two groups of word lines. A plurality of bit lines are folded on the reference word line symmetrically with respect to the reference word line and spaced at intervals from each other. Each of memory elements comprises a capacitive element and a switching transistor having a source connected to the capacitive element, a drain connected to one of the bit lines, and a gate connected to one of the word lines. The memory elements are disposed in a matrix such that they are spaced across and along the word lines and paired memory elements whose switching transistors have drains connected to the same bit line are positioned symmetrically with respect to the reference word line.

6 Claims, 7 Drawing Sheets

FIG. 7

$9_1$ FIRST DEAD SPACE REGION
$WL_{L-2}$ WORD LINE
$WL_{L-1}$ $RW_1$ REFERENCE WORD LINE
$WL_L$
$WL_{L+1}$
$9_2$ SECOND DEAD SPACE REGION
BIT LINE
$BL_0$
$BL_1$
$BL_2$ $WL_0$
$WL_1$
$WL_2$ $BL_{N-3}$
$BL_{N-2}$
$BL_{N-1}$ $9_3$ THIRD DEAD SPACE REGION $WL_{I-2}$ $WL_{I+1}$
$WL_{I-1}$ $WL_I$
$RW_2$
$9_4$ FOURTH DEAD SPACE REGION

SEMICONDUCTOR MEMORY WITH OBLIQUE FOLDED BIT-LINE ARRANGEMENT

BACKGROUND OF THE INVENTION

The present invention relates to a semiconductor memory, and more particularly to a semiconductor memory in the form of a dynamic random-access memory (DRAM) having a sense amplifier for amplifying the potential difference between a pair of bit lines.

Dynamic random-access memories (DRAMs) are made up of memory elements each composed of one capacitive element and one switching insulated gate field effect transistor connected to the capacitive element. The capacitive element is connected to either the source or drain of the switching insulated gate field effect transistor. For the sake of brevity, however, it is assumed in the following description that the capacitive element is connected to the source of the switching insulated gate field effect transistor. In the DRAMs of such an arrangement, the effect of external noise on a bit line connected to the capacitive element should be reduced as much as possible in order to detect a slight potential variation which is developed over the bit line connecting to the capacitive element through the insulated gate field effect transistor. It is effective to employ a folded bit-line arrangement to minimize the effect of external noise on the bit line. In order to employ the folded bit-line arrangement while maintaining a memory operation margin, however, it is necessary to arrange memory elements such that the same number of memory elements are connected to each of paired bit lines.

FIG. 1 shows a conventional semiconductor memory with the folded bit-line arrangement. In FIG. 1, the semiconductor memory has memory elements arranged such that a plurality of word lines (only word lines $WL_2$-$WL_7$ are shown) extend linearly and parallel to each other and a plurality of bit lines (only bit lines $BL_1$, $BL_1'$, $BL_2$ are shown) extend linearly and parallel to each other at an angle of 90° to the word lines. The paired bit lines, for example the bit lines $BL_1$, $BL_1'$, are disposed adjacent to each other. The memory elements are arranged such that two memory elements are combined into a unit. Namely, as indicated in a memory element region $1_{12}$ shown in an upper central portion of FIG. 1, two memory elements each having a switching transistor with a common drain $12_{12}$ are combined into a unit. Specifically, in memory element region $1_{12}$, a memory element comprising a capacitive element $11_{13}$, a gate $13_{13}$, and the drain $12_{12}$, and a memory element comprising a capacitive element $11_{14}$, a gate $13_{14}$, and the drain $12_{12}$ are positioned symmetrically with respect to the drain $12_{12}$.

A plurality of memory element regions (only memory element regions $1_{11}$-$1_{13}$, $1_{21}$-$1_{22}$, $1_{31}$-$1_{33}$ are shown) are arranged in a matrix. The memory element regions are each positioned after every four word lines in the horizontal direction parallel to the bit lines, and staggered horizontally by two word lines alternately in the vertical direction across the bit lines. Specifically, the upper central memory element region $1_{12}$ is formed such that gate $13_{13}$ of the left memory element is connected to the third word line $WL_4$ from the left and gate $13_{14}$ of the right memory element is connected to the fourth word line $WL_5$ from the left. Memory element region $1_{21}$, which is located in the left middle portion, is formed such that gate $13_{21}$ of the left memory element is connected to the first word line $WL_2$ from the left and gate $13_{22}$ of the right memory element is connected to the second word line $WL_3$ from the left. Memory element region $1_{22}$, which is positioned adjacent and to the right of memory element region $1_{21}$, is formed such that gate $13_{23}$ of the left memory element is connected to the fifth word line $WL_6$ from the left and gate $13_{24}$ of the right memory element is connected to the sixth word line $WL_7$ from the left. Memory element region $1_{32}$, which is located in a lower central portion of FIG. 1, is formed such that gate $13_{33}$ of the left memory element is connected to the third word line $WL_4$ from the left and gate $13_{34}$ of the right memory element is connected to the fourth word line $WL_5$ from the left.

The drains of the memory elements positioned along a certain bit line are connected to each other by this bit line. Specifically, the drains $12_{11}$-$12_{13}$ (the drains $12_{11}$, $12_{13}$ are not shown) of the memory elements in the memory element regions $1_{11}$-$1_{13}$ positioned along the uppermost bit line $BL_1$ are connected to each other by bit line $BL_1$. Drains $12_{21}$-$12_{22}$ of the memory elements in memory element regions $1_{21}$-$1_{22}$ positioned along the second bit line $BL_1'$ from above are connected to each other by bit line $BL_1'$.

Because the memory element regions are each positioned after every four word lines in the horizontal direction parallel to the bit lines and staggered horizontally by two word lines alternately in the vertical direction across the bit lines, as described above, there is a dead space region 6 with no memory element region formed in a portion (indicated by the broken line in FIG. 1) surrounded by the four memory element regions $1_{12}$, $1_{21}$, $1_{22}$, and $1_{32}$.

It has been proposed to reduce the dead space region 6 by changing the angle between the bit and word lines to an angle other than 90°. According to this proposal, as shown in FIG. 2, the bit lines are arranged to interconnect the drains of memory elements that are successively arrayed obliquely upwardly. Specifically, a drain $12_{22}$ of a memory element region $1_{22}$, which is the second from the upper left, and a drain $12_{13}$ of a memory element region $1_{13}$, which is the first from above and the third from the left, are interconnected by a bit line $B_{L+1}$. A drain $12_{31}$ of a memory element region $1_{31}$, which is the third from above and the first from the left, and a drain $12_{23}$ of a memory element region $1_{23}$, which is the second from above and the third from the left, are interconnected by a bit line $B_{L'}$.

With the arrangement shown in FIG. 2, the memory element regions are each positioned after every three word lines in the horizontal direction parallel to the bit lines and staggered horizontally by one word line alternately in the vertical direction across the bit lines, thus reducing the dead space region 6 shown in FIG. 1. However, the overall DRAM structure is obliquely oriented toward the upper right as shown in FIG. 3, resulting in new dead space regions $5_1$, $5_2$ in upper left and lower right portions. As a consequence, the chip area of the DRAM must be larger than necessary for the memory element regions.

Since the memory element regions are each positioned after every three word lines in the horizontal direction parallel to the bit lines and staggered horizontally by one word line alternately in the vertical direction across the bit lines in the memory element layout shown in FIG. 2, the memory element regions $1_{11}$-$1_{13}'$, which are the first from above, and the memory element regions $1_{21}$-$1_{23}$, which are the second from above, share a third word line $WL_{k+2}$ from the left and a sixth word line $WL_{k+5}$ from the left. Therefore, bit lines that are paired are not positioned adjacent to each other. In the illustrated example, inasmuch as the memory element regions $1_{11}$-$1_{13}$, which are the first from above, do not share any word lines with the memory element regions $1_{31}$-$1_{33}$, which are the third from above, bit lines that are paired are spaced from each other by one bit line. Specifically, a second bit line $BL_L$ from above is paired with a fourth bit line $BL_L'$ from above, and a third bit line $BL_{L+1}$ from above is paired with a fifth bit line $BL_{L+1}'$ from above.

SUMMARY OF THE INVENTION

An object of the present invention is to provide a semiconductor memory with a folded bit-line arrangement which has minimum dead space region for reduced chip area.

Other objects of the present invention will become obvious from the following description.

In accordance with an aspect of the present invention, there is provided a semiconductor memory comprising: a plurality of word lines extending linearly and parallel to each other; a reference word line disposed between and extending parallel to the word lines; a plurality of bit lines folded on the reference word line symmetrically with respect to the reference word line and spaced at intervals from each other; and a matrix of memory elements spaced across and along the word lines, each of the memory elements comprising a capacitive element and a switching transistor having a source connected to the capacitive element, a drain connected to one of the bit lines, and a gate connected to one of the word lines; the memory elements including paired memory elements each having the switching transistor with the drain connected to the same bit line, the paired memory elements being disposed symmetrically with respect to the reference word line.

In accordance with another aspect of the present invention, there is provided a semiconductor memory comprising: a plurality of word lines extending linearly and parallel to each other; a plurality of reference word lines disposed after every predetermined number of the word lines and extending parallel to the word lines; a plurality of bit lines folded on the reference word lines in a zigzag pattern symmetrically with respect to the reference word lines and spaced at intervals from each other; and a matrix of memory elements spaced across and along the word lines, each of the memory elements comprising a capacitive element and a switching transistor having a source connected to the capacitive element, a drain connected to one of the bit lines, and a gate connected to one of the word lines; the memory elements including paired memory elements each having the switching transistor with the drain connected to the same bit line, the paired memory elements being disposed symmetrically with respect to one of the reference word lines.

BRIEF DESCRIPTION OF THE DRAWINGS

The features and advantages of the present invention will become apparent from the following description when taken in conjunction with the accompanying drawings in which:

FIG. 7 is a schematic view of the overall layout of the semiconductor memory shown in FIG. 6.

DESCRIPTION OF THE PREFERRED EMBODIMENTS

Figure 4:
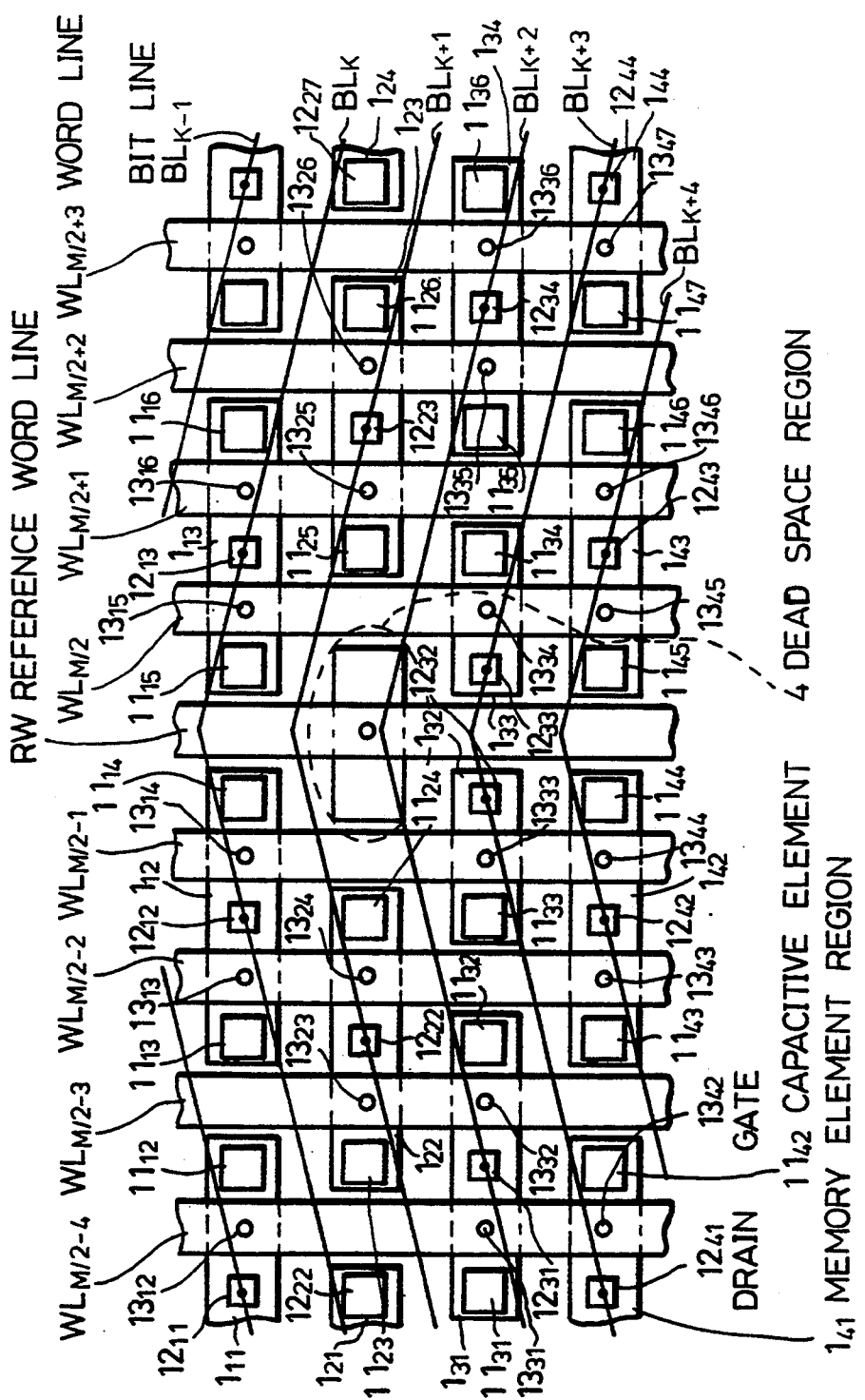
FIG. 4 is a fragmentary view of the layout of a semiconductor memory according to an embodiment of the present invention.

As shown in FIG. 4, a semiconductor memory according to an embodiment of the present invention has a plurality of word lines (only word lines $WL_{M/2-4}$-$WL_{M/2+3}$ are shown) extending linearly and parallel to each other, a reference word line RW positioned to divide the word lines into two groups, i.e., between the fourth word line $WL_{M/2-1}$ from the left and the fifth word line $WL_{M/2}$ from the left, and a plurality of bit lines (only bit lines $BL_{K-1}$-$BL_{K+3}$ are shown) folded on reference word line RW symmetrically with respect thereto and extending at spaced intervals. Each of the bit lines is of a folded configuration and extends obliquely across the word lines and reference word line RW at a certain angle. Each of the bit lines is electrically insulated from the word lines and reference word line RW. The semiconductor memory also has a plurality of memory elements each composed of one capacitive element and one switching transistor whose source is connected to the capacitive element. The switching transistor has a drain connected to a bit line and a gate connected to a word line.

The memory elements are arranged in a matrix such that they are spaced across and along the word lines and paired memory elements whose switching transistors have drains connected to the same bit line are positioned symmetrically with respect to reference word line RW.

Specifically, in a first row (uppermost row) of memory element regions, memory element region $1_{12}$, which is composed of two memory elements each having a switching transistor with a common drain $12_{12}$ connected to bit line $BL_K$, is positioned to the left of reference word line RW with gate $13_{13}$ of one of the memory elements being connected to word line $WL_{M/2-2}$ and gate $13_{14}$ of the other memory element being connected to word line $WL_{M/2-1}$. Memory element region $1_{13}$, which is composed of two memory elements each having a switching transistor with a common drain $12_{13}$ connected to bit line $BL_K$, is positioned to the right of reference word line RW with gate $13_{15}$ of one of the memory elements being connected to word line $WL_{M/2}$ and gate $13_{16}$ of the other memory element being connected to word line $WL_{M/2+1}$.

In a second row of memory element regions, memory element region $1_{22}$, which is composed of two memory elements each having a switching transistor with a common drain $12_{22}$ connected to bit line $BL_{K+1}$, is positioned to the left of reference word line RW with gate $13_{23}$ of one of the memory elements being connected to word line $WL_{M/2-3}$ and gate $13_{24}$ of the other memory element being connected to word line $WL_{M/2-2}$. Memory element region $1_{23}$, which is composed of two memory elements each having a switching transistor with a common drain $12_{23}$ connected to bit line $BL_{K+1}$, is positioned to the left of reference word line RW with gate $13_{25}$ of one of the memory elements being connected to word line $WL_{M/2+1}$ and gate $13_{26}$ of the other memory element being connected to word line $WL_{M/2+2}$.

In a third row of memory element regions, memory element region $1_{32}$, which is composed of one memory element having a switching transistor with common drain $12_{32}$ connected to bit line $BL_{K+3}$, is positioned to the left of reference word line RW with gate $13_{33}$ of the memory element being connected to word line $WL_{M/2-1}$. Memory element region $1_{31}$, which is composed of two memory elements each having a switching transistor with a common drain $12_{31}$ connected to bit line $BL_{K+2}$, is positioned to the left of memory element region $1_{32}$ with gate $13_{31}$ of one of the memory elements being connected to word line $WL_{M/2-4}$ and gate $13_{32}$ of the other memory element being connected to word line $WL_{M/2-3}$. Memory element region $1_{33}$, which is composed of one memory element having a switching transistor with a drain $12_{33}$ connected to bit line $BL_{K+3}$, is positioned to the right of reference word line RW with gate $13_{34}$ of the memory element being connected to word line $WL_{M/2}$. Memory element region $1_{34}$, which is composed of two memory elements each having a switching transistor with a common drain $12_{34}$ connected to bit line $BL_{K+2}$, is positioned to the left of memory element region $1_{33}$ with gate $13_{35}$ of one of the memory elements being connected to word line $WL_{M/2+2}$ and gate $13_{36}$ of the other memory element being connected to word line $WL_{M/2+3}$.

In the fourth and following rows, the memory element regions are arranged according to the same pattern as the first through third rows of the memory element regions.

In the embodiment shown in FIG. 4, paired bit lines are spaced from each other by one bit line. For example, bit line $BL_K$ is paired with bit line $BL_{K+2}$, and bit line $BL_{K+1}$ is paired with bit line $BL_{K+3}$.

Figure 1:
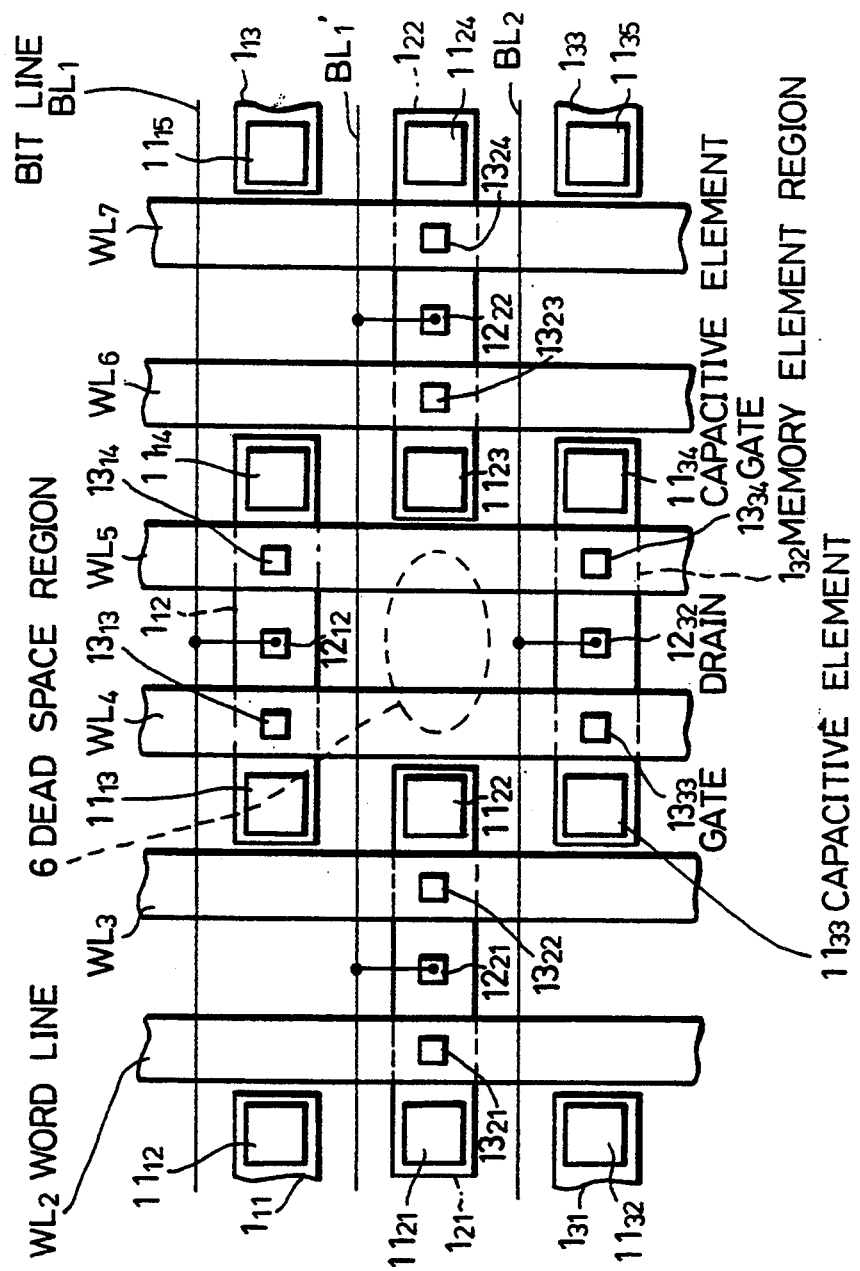
FIG. 1 is a fragmentary view of the layout of a conventional semiconductor memory with a folded bit-line arrangement.
Figure 2:
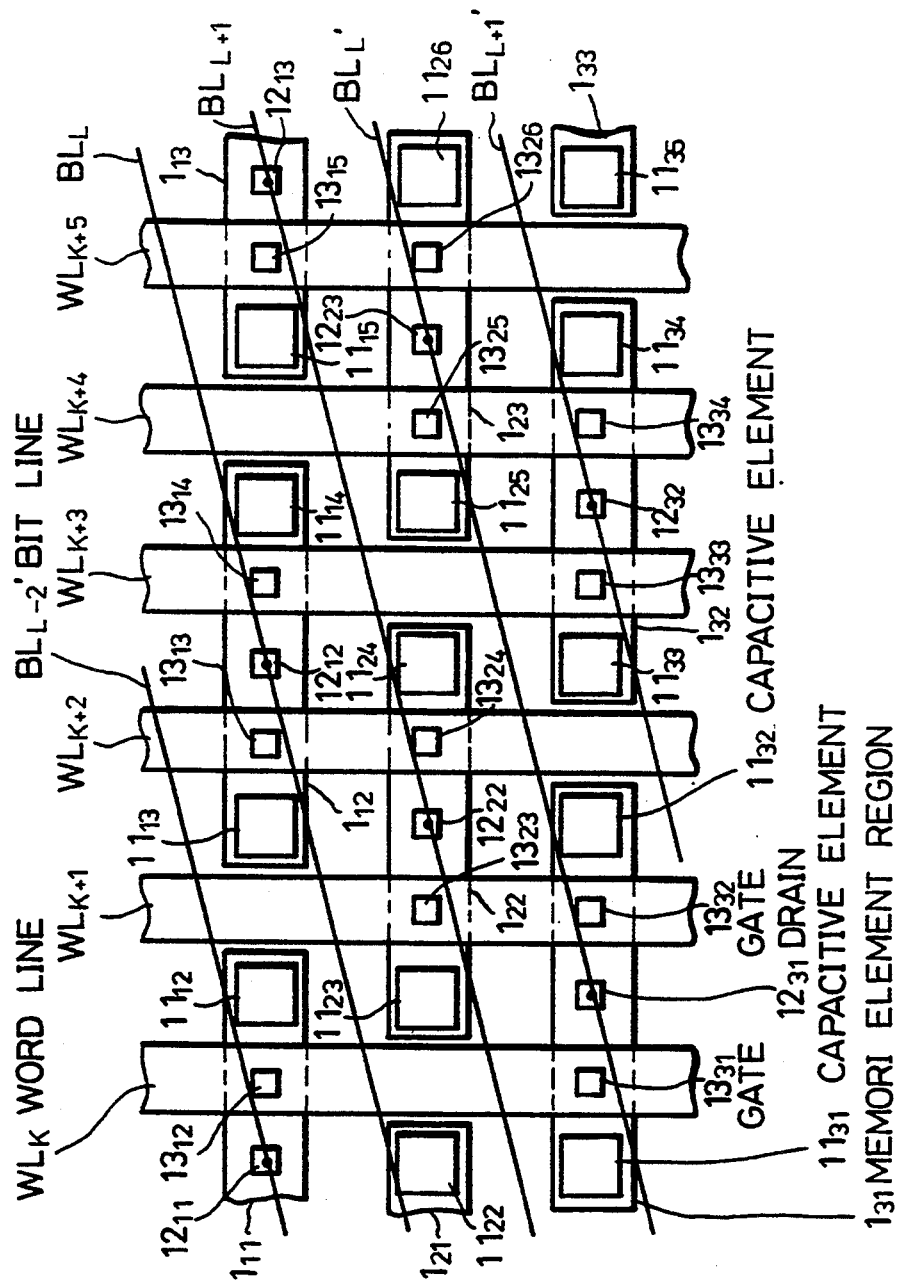
FIG. 2 is a fragmentary view of the layout of another conventional semiconductor memory with a folded bit-line arrangement.
Figure 3:
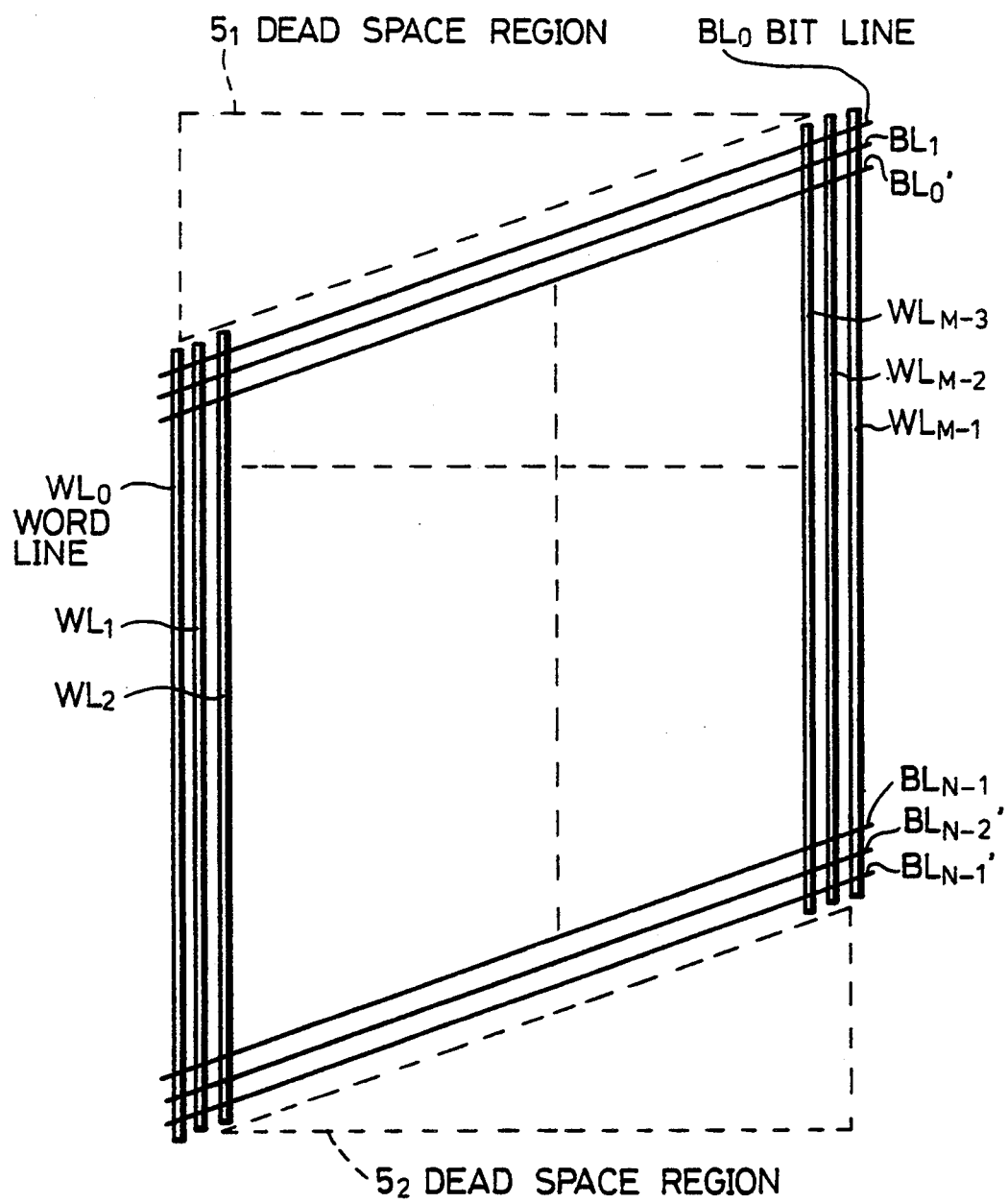
FIG. 3 is a schematic view illustrative of a problem of the layout of the conventional semiconductor memory shown in FIG. 2.
Figure 5:
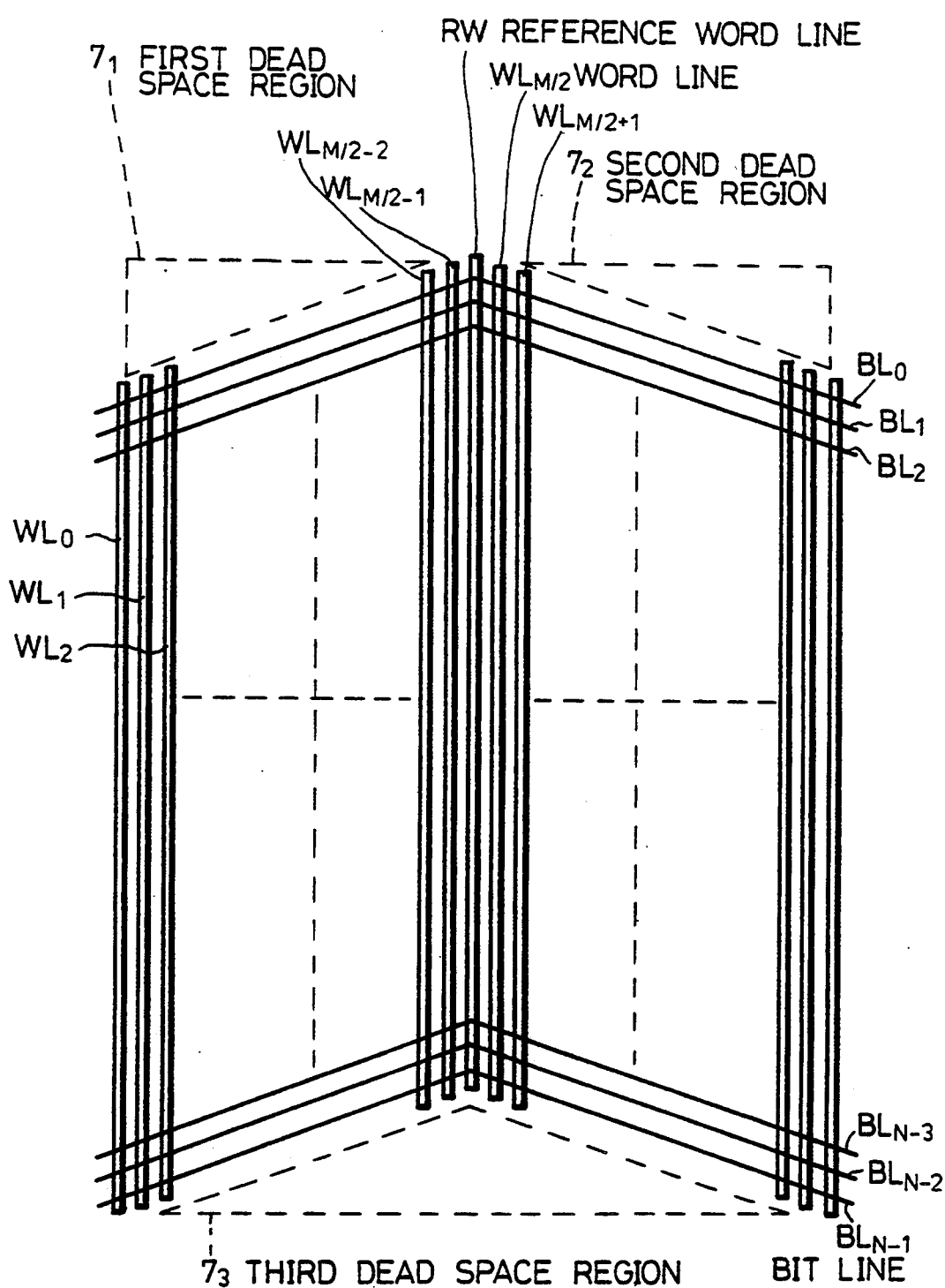
FIG. 5 is a schematic view of the overall layout of the semiconductor memory shown in FIG. 4.

In the embodiment shown in FIG. 4, a dead space region 4 with no memory element region formed therein is produced across reference word line RW between word line $WL_{M/2-1}$ and word line $WL_{M/2}$ in the second row. In the overall layout of the semiconductor memory, as shown in FIG. 5, first through third dead space regions $7_1$-$7_3$ are created in the upper left, upper right, and lower portions. However, the sum of the areas of the dead space regions in the semiconductor memory shown in FIGS. 4 and 5 is smaller than the sum of the areas of the dead space regions 6 in the semiconductor memory shown in FIG. 1 and the sum of the areas of the dead space regions $5_1$, $5_2$ in the semiconductor memory shown in FIG. 3.

Figure 6:
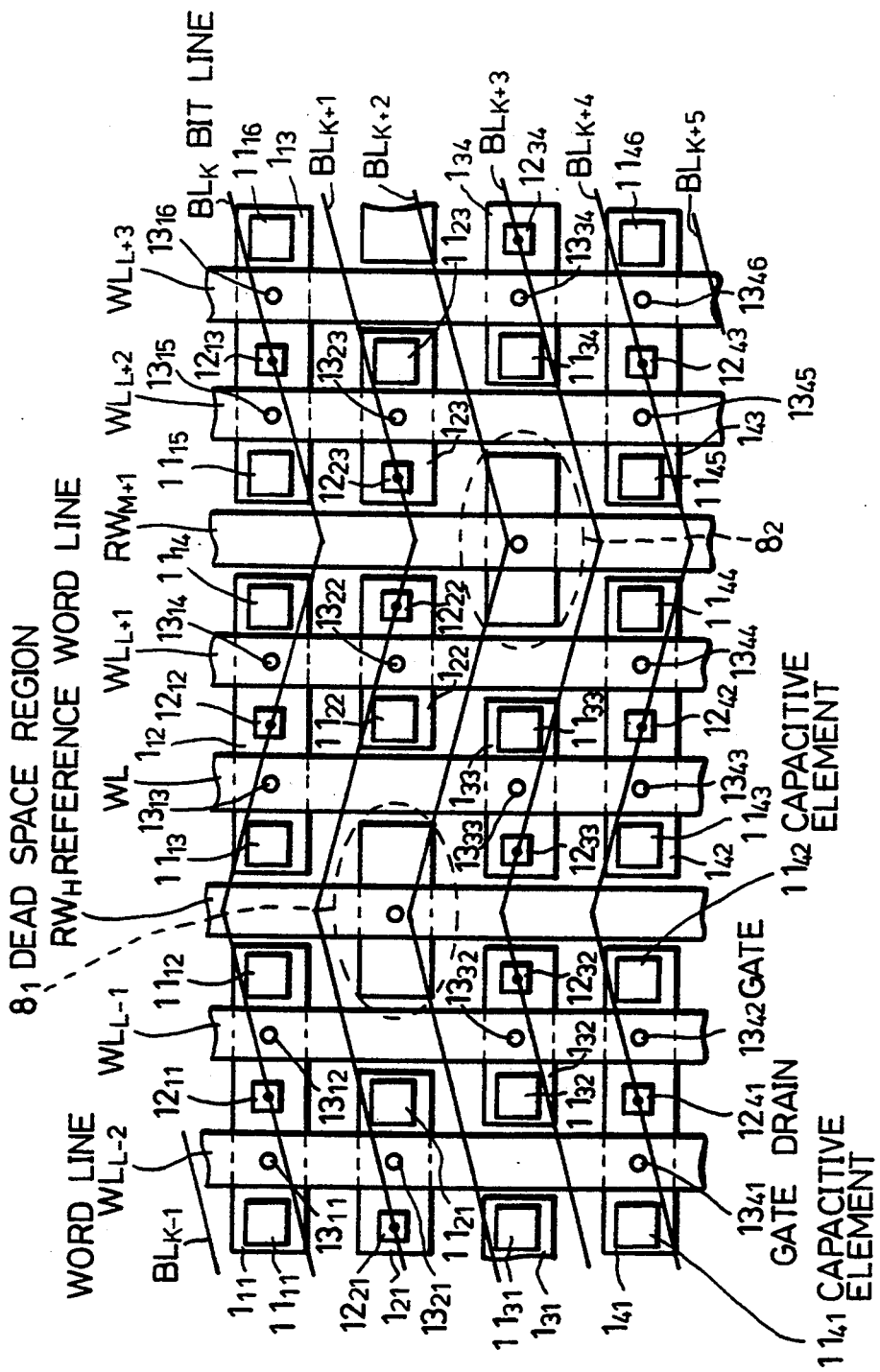
FIG. 6 is a fragmentary view of the layout of a semiconductor memory according to another embodiment of the present invention.

As shown in FIG. 6, a semiconductor memory according to another embodiment of the present invention has a plurality of word lines (only word lines $WL_{L-2}$-$WL_{L+3}$ are shown) extending linearly and parallel to each other, a plurality of reference word lines (only reference word lines $RW_H$, $RW_{H+1}$ are shown) positioned after every two word lines and extending parallel to the word lines, and a plurality of bit lines (only bit lines $BL_{K-1}$-$BL_{K+5}$ are shown) folded on the reference word lines in a zigzag pattern symmetrically with respect thereto and extending at spaced intervals. Each of the bit lines is of a zig-zag-folded configuration with folds on the respective reference word lines and extends obliquely across the word lines and the reference word lines at a certain angle. Each of the bit lines is electrically insulated from the word lines and the reference word lines. The semiconductor memory also has a plurality of memory elements each composed of one capacitive element and one switching transistor whose source is connected to the capacitive element. The switching transistor has a drain connected to a bit line and a gate connected to a word line.

The memory elements are arranged in a matrix such that they are spaced across and along the word lines and paired memory elements whose switching transistors have drains connected to the same bit line are positioned symmetrically with respect to one of the reference word lines.

Specifically, in a first row (uppermost row) of memory element regions, memory element region $1_{11}$, which is composed of two memory elements each having a switching transistor with a common drain $12_{11}$ connected to bit line $BL_K$, is positioned to the left of left reference word line $RW_H$ with gate $13_{11}$ of one of the memory elements being connected to word line $WL_{L-2}$ and gate $13_{12}$ of the other memory element being connected to word line $WL_{L-1}$. Memory element region $1_{12}$, which is composed of two memory elements each having a switching transistor with a common drain $12_{12}$ connected to bit line $BL_K$, is positioned to the right of reference word line $RW_H$ with gate $13_{13}$ of one of the memory elements being connected to word line $WL_L$ and gate $13_{14}$ of the other memory element being connected to word line $WL_{L+1}$. Memory element region $1_{13}$, which is composed of two memory elements each having a switching transistor with a common drain $12_{13}$ connected to bit line $BL_K$, is positioned to the right of right reference word line $RW_{H+1}$ with gate $13_{15}$ of one of the memory elements being connected to word line $WL_{L+2}$ and gate $13_{16}$ of the other memory element being connected to word line $WL_{L+3}$.

In a second row of memory element regions, memory element region $1_{21}$, which is composed of one memory element having a switching transistor with a drain $12_{21}$ connected to bit line $BL_{K+1}$, is positioned to the left of left reference word line $RW_H$ with gate $13_{21}$ of the memory element being connected to word line $WL_{L-2}$. Memory element region $1_{22}$, which is composed of one memory element having a switching transistor with a drain $12_{22}$ connected to bit line $BL_{K+1}$, is positioned to the right of reference word line $RW_H$ with gate $13_{22}$ of the memory element being connected to word line $WL_{L+1}$. Memory element region $1_{23}$, which is composed of one memory element having a switching transistor with a drain $12_{23}$ connected to bit line $BL_{K+1}$, is positioned to the right of right reference word line $RW_{H+1}$ with gate $13_{23}$ of the memory element being connected to word line $WL_{L+2}$.

In a third row of memory element regions, memory element region $1_{32}$, which is composed of one memory element having a switching transistor with a drain $12_{32}$ connected to bit line $BL_{K+3}$, is positioned to the left of left reference word line $RW_H$ with gate $13_{32}$ of the memory element being connected to word line $WL_{L-1}$. Memory element region $1_{33}$, which is composed of one memory element having a switching transistor with a drain $12_{33}$ connected to bit line $BL_{K+3}$, is positioned to the right of reference word line $RW_H$ with gate $13_{33}$ of the memory element being connected to word line $WL_L$. Memory element region $1_{34}$, which is composed of one memory element having a switching transistor with a drain $12_{34}$ connected to bit line $BL_{K+3}$, is positioned to the right of right reference word line $RW_{H+1}$ with gate $13_{34}$ of the memory element being connected to word line $WL_{L+3}$.

In the fourth and following rows of the memory element regions, the memory element regions are arranged according to the same pattern as the memory element regions in the first through third rows.

In the embodiment shown in FIG. 6, paired bit lines are spaced from each other by one bit line. For example, bit line $BL_K$ is paired with bit line $BL_{K+2}$, and bit line $BL_{K+1}$ is paired with bit line $BL_{K+3}$.

In the embodiment shown in FIG. 6, a dead space region $8_1$ with no memory element region formed therein is produced across left reference word line $RW_H$ between word line $WL_{L-1}$ and word line $WL_L$ in the second row, and a dead space region $8_2$ with no memory element region formed therein is produced across right reference word line $RW_{H+1}$ between word line $WL_{L+1}$ and word line $WL_{L+2}$ in the third row. As shown in FIG. 7, in the overall layout of the semiconductor memory, first through fourth dead space regions $9_1$-$9_4$ are created in the upper left, upper right, lower left, and lower right portions. However, the sum of the areas of the dead space regions in the semiconductor memory shown in FIGS. 6 and 7 is smaller than the sum of the areas of the dead space regions 6 in the semiconductor memory shown in FIG. 1 and the sum of the areas of the dead space regions $5_1$, $5_2$ in the semiconductor memory shown in FIG. 3.

While a plurality of reference word lines are each disposed after every two word lines in the semiconductor memory shown in FIG. 6, each reference word line may be disposed after every three or more word lines, and the bit lines may be folded at more locations. The number of folds of the bit lines may be set to an optimum value insofar as the same number of memory elements are connected to each of paired bit lines and the sum of areas of dead space regions produced by the folds of the bit lines is reduced.

While the present invention has been described in conjunction with preferred embodiments thereof, it will now be possible for one skilled in the art to easily put the present invention into practice in various other manners.

What is claimed is:

1. A semiconductor memory comprising:
   a plurality of word lines extending linearly, arranged parallel to each other, and spaced at a first predetermined interval, one of the plurality of word lines being allocated as a reference word line,
   a matrix of a plurality of memory elements with arrays of the memory elements aligned in a first direction perpendicular to the word lines and also aligned in a second direction slanted with respect to the direction of the reference word line, any two successive memory elements aligned in the second direction being shifted by a prescribed distance from each other in the first direction so that memory elements on both sides of the reference word line are arranged symmetrically with respect to the reference word line, a memory element being generally a pair of identical memory cells symmetrically formed with respect to a common diffusion-layer electrode with gates individually connected to two neighboring word lines, and
   a plurality of bit lines bent at the reference word line and extending linearly across a word line on both sides of the reference word line in a direction slanted relative to the first direction and symmetrical with respect to the reference word line, and arranged parallel to each other at a second predetermined interval, wherein each pair of bit lines spaced at a regular interval are two sections of one folded bit line, the folded bit line being selectively connected to common diffusion-layer electrodes of the memory elements, any two gates of which are not connected to the same word line.

2. The semiconductor memory as claimed in claim 1, wherein two neighboring memory elements aligned in the first direction are spaced apart from each other so that one word line is interposed between the nearest gates of different memory elements, said prescribed distance being equal to the first predetermined interval, and a folded bit line being made up of a pair of bit lines separated by one bit line.

3. The semiconductor memory as claimed in claim 1, wherein the plurality of memory elements includes memory elements made up of a single memory cell, the memory elements made up of a single memory cell being arranged in matrix element regions near reference word lines, which are too narrow to receive memory elements made up of a pair of memory cells.

4. The semiconductor memory as claimed in claim 1, wherein the diffusion-layer electrode is a drain.

5. The semiconductor memory as claimed in claim 1, wherein the diffusion-layer electrode is a source.

6. A semiconductor memory comprising
   a plurality of word lines extending linearly, arranged parallel to each other, and spaced at a first predetermined interval, wherein a plurality of word lines spaced at a second predetermined interval are allocated as reference word lines,
   a matrix of a plurality of memory elements with arrays of the memory elements aligned in a first direction perpendicular to the word lines and also aligned in a second direction slated with respect to the direction of the reference word line, any two successive memory elements aligned in the second direction being shifted by a prescribed distance from each other in the first direction so that memory elements on both sides of each reference word line are arranged symmetrically with respect to the reference word line concerned, and a memory element being generally a pair of identical memory cells formed symmetrically with respect to a common diffusion-layer electrode with gates individually connected to two neighboring word lines, and
   a plurality of bit lines bent at each reference word line extending across a word line linearly on both sides of each of the reference word lines in a direction slanted relative to the first direction and symmetrical with respect to the reference word line and arranged parallel to each other at a third predetermined interval, thereby forming parallel zigzag bit lines, wherein each pair of bit lines spaced at a regular interval are two sections of one folded bit line, each of the folded bit lines being connected selectively to common diffusion-layer electrodes of the memory elements, any two gates of which are not connected to the same word line.

* * * * *

UNITED STATES PATENT AND TRADEMARK OFFICE
CERTIFICATE OF CORRECTION

PATENT NO. : 5,391,901

DATED : February 21, 1995

INVENTOR(S) : Nobuhiro Tanabe

It is certified that error appears in the above-identified patent and that said Letters Patent is hereby corrected as shown below:

Column 2, line 67, delete "$1_{11}-1_{13}$", and insert --$1_{11}-1_{13}$--;

Signed and Sealed this

First Day of August, 1995

*Attest:*

BRUCE LEHMAN

*Attesting Officer*     *Commissioner of Patents and Trademarks*